(12) United States Patent
Koepsell (10) Patent No.: US 9,728,879 B2
(45) Date of Patent: Aug. 8, 2017

(54) SEALED CONNECTOR (71) Applicant: Johnson Electric S.A., Murten (CH)

(72) Inventor: Martin Koepsell, Ennepetal (DE)

(73) Assignee: JOHNSON ELECTRIC S.A., Murten (CH)

( * ) Notice: Subject to any disclaimer, the term of this patent is extended or adjusted under 35 U.S.C. 154(b) by 0 days.

(21) Appl. No.: 15/189,586

(22) Filed: Jun. 22, 2016

(65) Prior Publication Data

US 2016/0380380 A1 Dec. 29, 2016

(30) Foreign Application Priority Data

Jun. 23, 2015 (DE) .................. 10 2015 110 070

(51) Int. Cl.
| | |
|---|---|
| *H01R 13/03* | (2006.01) |
| *H01R 12/70* | (2011.01) |
| *H01R 12/77* | (2011.01) |
| *H01R 12/91* | (2011.01) |
| *B33Y 80/00* | (2015.01) |
| *H01R 13/52* | (2006.01) |
| *H05K 1/02* | (2006.01) |
| *H05K 1/11* | (2006.01) |

(52) U.S. Cl.
CPC .............. *H01R 13/03* (2013.01); *B33Y 80/00* (2014.12); *H01R 12/7088* (2013.01); *H01R 12/777* (2013.01); *H01R 12/91* (2013.01); *H01R 13/521* (2013.01); *H01R 13/5202* (2013.01); *H05K 1/028* (2013.01); *H05K 1/118* (2013.01); *H05K 2201/055* (2013.01); *H05K 2201/09081* (2013.01); *H05K 2203/1173* (2013.01)

(58) Field of Classification Search
CPC ..................................................... H01R 13/03
See application file for complete search history.

(56) References Cited

U.S. PATENT DOCUMENTS 4,818,596 A * 4/1989 Cook ..................... A41D 31/00
427/307
6,113,407 A * 9/2000 Martin ................. H01R 13/521
439/205

(Continued)

FOREIGN PATENT DOCUMENTS

DE 20201410383 U1 11/2014
WO WO 2016/015876 A1 2/2016

OTHER PUBLICATIONS

Chunlei Guo, 'Laser-generated Surface Structures Create Extremely Water Repellent Metals', Jan. 20, 2015, pp. 1-4, url http://www.rochester.edu/newscenter/superhydrophobic-metals-85592/, retrieved on Aug. 5, 2015.

(Continued)

*Primary Examiner* — James Harvey
(74) *Attorney, Agent, or Firm* — Muncy, Geissler, Olds & Lowe, P.C.

(57) ABSTRACT

A sealed electrical connection assembly joins an electrical component to a plug-in component. For liquid-tight sealing, the free, deformable ends of the conductor tracks of the electrical component and/or the contact elements of the plug-in component are provided with hydrophobic surfaces at least regionally, so that even after a plurality of plug contact operations have been performed, in the coupling position and, optionally, in the uncoupled position, the contact region is surrounded by hydrophobic surfaces.

12 Claims, 12 Drawing Sheets (56) References Cited

U.S. PATENT DOCUMENTS

| | | | |
|---|---|---|---|
| 7,144,256 B2 | 12/2006 | Pabst et al. | |
| 9,121,505 B2 | 9/2015 | Kurth et al. | |
| 2002/0164893 A1* | 11/2002 | Mathieu | G01R 1/06727 439/66 |
| 2003/0129866 A1* | 7/2003 | Romano | H01R 13/03 439/81 |
| 2012/0003851 A1* | 1/2012 | Nishikawa | H01R 12/714 439/78 |
| 2013/0248339 A1* | 9/2013 | Koepsell | H01H 13/20 200/524 |
| 2014/0102759 A1* | 4/2014 | Schmidt | H01H 1/02 174/126.1 |
| 2014/0357102 A1 | 12/2014 | Koepsell | |
| 2015/0122620 A1* | 5/2015 | Koepsell | H01H 5/04 200/468 |
| 2016/0380380 A1* | 12/2016 | Koepsell | B33Y 80/00 439/283 |

OTHER PUBLICATIONS

A. Y. Vorobyev et al., 'Multifunctional Surfaces Produced by Femtosecond Laser Pulses' Journal of Applied Physics, 117, Jan. 20, 2015, pp. 1-6.

\* cited by examiner

SEALED CONNECTOR

CROSS REFERENCE TO RELATED APPLICATIONS

This non-provisional patent application claims priority under 35 U.S.C. §119(a) from Patent Application No. DE102015110070.3 filed in Germany on Jun. 23, 2015, the entire contents of which are hereby incorporated by reference.

FIELD OF THE INVENTION

This invention relates to a plug-in type electrical connector and in particular to an electrical connection assembly between an electrical component and a plug-in component, for use in the electrical connector.

BACKGROUND OF THE INVENTION

Known plug-in electrical connectors comprise a plug-in component, which is plugged into an electrical component to create the electrical connection in a corresponding coupling part and to achieve an electrical connection, the contacts of the component are brought into contact in the plug-in direction with the counter contacts of the plug-in component. In order to protect existing gaps in the housings of these components from penetration of liquids, various seals are known. For example, sealing rings or other sealing elements made of elastomers are used in the corresponding electrical components and plug-in components, in order to seal the electrical connection assembly, namely the plugged-in connection between the electrical component and the plug-in component, in the coupling position. Sealing elements made of deformed elastomers used for the sealing produce disadvantageously large plug-in and release forces in the manufacture of plug-in connectors. With a large number of plug-in cycles, the sealing elements wear way. These sealing elements, and thus also the corresponding seal, are also highly dependent on temperature. Disadvantageously, a corresponding place in the components is also to be provided for the sealing elements. Furthermore, the electrical contacts both of the separate plug-in component and the separate electrical component are not protected in an uncoupled position.

Furthermore, an electrical circuit arrangement is known from US patent publication US20140357102(A1), which shows at least one flexible surface element, on which electrical conductor tracks are located. For power supply, a corresponding connector is provided in order to connect the conductor tracks electrically to a plug-in component with corresponding counter contacts. For contacting, the conductor tracks themselves are used. For this purpose, the conductor tracks in the corresponding terminal region are correspondingly exposed in order to provide an electrical contact. In the coupling position, counter contacts are created on these conductor tracks and therefore an electrical connection is produced. With such an electrical circuit arrangement, it is possible to perform a high number of plug-in and release cycles by means of the plug-in connectors, but this electrical circuit arrangement is not protected from penetration of liquids.

According to German utility model DE 20 2014 105 383 U1, to avoid the penetration of liquid into a plug-in housing of a plug-in component, a plurality of sealing elements are used, inter alia sealing rings made from a hydrophobic material, which are arranged between the contacts of the plug-in component. These sealing means are provided to seal against a penetration of liquids into the space enclosed by the housing. Here, too, the contacts themselves are not protected against the infiltration of liquids when the plug-in connection is opened.

SUMMARY OF THE INVENTION

Hence there is a desire for an electrical connection assembly between an electrical component and a plug-in component, which in the coupling position is sealed against penetrating liquid, where, the seal should be devoid of additional sealing elements and enable a high number of plug-in and release cycles maintenance-free.

Optionally, the contacts of the individual parts, namely of the electrical component and the plug-in component, may be protected so that the electrical contacts in the uncoupled position are kept free from liquids.

The electrical connection assembly according to the invention is manufactured between an electrical component and a plug-in component. The electrical component have here a plurality of conductor tracks on a flexible support. The free ends of the conductor tracks are exposed in at least one terminal region, so that they each form contact surfaces. Counter contacts are provided on the contact elements of a plug-in component. The plug-in component has for this purpose a number of contact elements corresponding to the number of conductor tracks, which are accommodated in a plug-in housing and are connected to electrical wires. In the coupled position, i.e. when a plug-in component is plugged in, an electrically conductive connection with the electrical component exists, namely between the free ends of the conductor tracks on the flexible support of the electrical component and the contact elements of the plug-in component. In this way, the electrical component can, for example, be supplied with power via the power lines of the plug-in component or even with data via data lines. The electrical component can also comprise electrical or electronic structural elements and in additional terminal regions the conductor tracks can be connected to additional electrical components, such as electric switches or electric motors. Here, the contacting is effected so that the contact region between the contact elements of the plugged-in plug-in component and the conductor tracks of the electrical component is surrounded by an outwardly widening gap. According to the invention, the free ends of the conductor tracks of the electrical component and/or the contact elements of the plug-in component are thus at least regionally provided with hydrophobic surfaces, so that even after a plurality of plug-in cycles have been performed, a secure sealing of the contacts exists. This sealing is effective in the coupling position. With provision of hydrophobic surfaces both on the electrical component as well as on the plug-in component, the sealing is also effective in the uncoupled position. The respective contact region, namely the contact region at the free ends of the conductor tracks as well as the contact region at the contact elements of the plug-in component is surrounded by hydrophobic surfaces, preferably completely surrounded. This means that a liquid-tight sealing both in the coupling position with the plugged-in plug-in component as well as a sealing and a protection of the contacts of the separate elements of the electrical connection assembly against liquid infiltration exists.

Hydrophobic surfaces can be achieved by a corresponding coating or preferably by a corresponding microstructuring, whereby contact angles with water >150° are possible, so that the hydrophobic surfaces are never wet. Furthermore, due to the so-called Moses effect, even the space above the hydrophobic surfaces is free from liquids up to a certain height, for example, at a contact angle of 150° the overlying space at a height of 0.5 to 1 mm is free from water. To produce the hydrophobic surfaces, the method for structuring metal surfaces by means of laser is preferably used, which has been described in "Laser-generated surface structures create extremely water repellent metals" by Chunlei Guo, University of Rochester, 2015, and "Multifunctional surfaces produced by femtosecond laser pulses", Journal of Applied Physics, 20 Jan. 2015. The advantage of this method is that the hydrophobic property is transferred to the treated surface and is then an inherent property of the metal of the treated conductor tracks or contact elements. Unlike hydrophobic coatings, which can detach or age. Furthermore, such coatings may represent electrical resistances on the free ends of the conductor track or on the contact elements and in each case in the contact region with the first contacts, where these hydrophobic coatings still exist completely or partially.

Now these hydrophobic surfaces exist around the contact region, namely at the free ends of the conductor tracks of the electrical component and/or on the contact elements of the plug-in components, so, in particular, when plugged in, an electrically conductive connection between the metal contacts is achieved with the provision of microstructuring, where the hydrophobic surfaces are inherent property of the metallic conductor tracks or the metallic contact element. Even with a hydrophobic coating of the surfaces around the contact region a contact is not prevented by the thin hydrophobic layers. Hydrophobic surfaces are very susceptible to scratching, so that the hydrophobic surfaces in the immediate contact region wear away after a plurality of plug-in cycles, despite which, both contact regions, namely the contact region at the free ends of the conductor tracks as well as the contact region on the contact elements of the plug-in component, are securely sealed, since the hydrophobic surfaces around this immediate contact region are not subject to any wearing away and therefore remain effective. This is irrespective of how large the contact region is, whether it is a selective or surface contact. If hydrophobic surfaces are provided both on the electrical component and on the plug-in component, then the contacts even in the uncoupled position are free from a negative liquid infiltration.

In one embodiment, hydrophobic surfaces may additionally exist in the region of such gaps, which occur between the plug-in housing of the plug-in component and the corresponding receptacle on the electrical component. Such a receptacle on the electrical component may be a receiving sleeve oriented in the plug-in direction adapted to the plug-in housing of the plug-in component, which is preferably closed-walled. In the coupling position gaps remain between the plug-in housing and the receiving sleeve. At least one of the corresponding gap surfaces may additionally be provided with hydrophobic surfaces, as is described in WO2016/015876. Here, the hydrophobic surfaces may be provided either on the gap surfaces in the receiving sleeve and/or on the gap surfaces on the plug-in housing. In most cases, it is sufficient to provide a sealing with hydrophobic surfaces on one component. These additional hydrophobic surfaces replace the previously known sealing rings, wherein, advantageously, no additional space must be provided for these hydrophobic surfaces in the components.

In one embodiment, for the sealing of the electrical connection assembly, hydrophobic surfaces are only provided on the electrical component, preferably on the flexible support.

For the new electrical connection assembly according to the invention, a new electrical component is provided which exhibits a flexible support having a plurality of conductor tracks, wherein at least in one terminal region the ends of the conductor tracks are exposed and each form contact surfaces. Here, the ends of the conductor tracks are freely movable. This is achieved in that slots are provided in the flexible support, which surround the ends of the conductor tracks in a U-shape. Furthermore, the flexible support is bent in this terminal region so that the exposed contact surfaces are located at the ends of the conductor tracks after the fold on the underside of the flexible support and on the opposite upper side in each case an elastic support layer is provided for the ends of the conductor tracks. This support layer may be applied to the flexible support by 3D printing. For each end of the conductor tracks, one or a common metallic spring leaf may be attached to the flexible support. A common spring leaf also has slots corresponding to and fitting the slots of the flexible support. Upon contact of the free ends of the conductor tracks by a counter contact, a contact element of a plug-in component, for example, the ends of the conductor tracks oriented flat in the flexible support are moved upwards and deformed bulgingly. Here, the support layer ensures the necessary contact pressure.

Such a flexible support may be arranged in a component support. In an advantageous embodiment, a liquid-tight sealing with hydrophobic surfaces is, in particular, provided in the region of the free ends of the conductor tracks, so that a potential contact region is completely enclosed by hydrophobic surfaces.

The new plug-in component, in particular for the new electrical connection assembly according to the invention, exhibits a corresponding number of contact elements, which are each received in a plug-in housing and connected to electric wires and/or data lines. For liquid-tight sealing, in particular of the contact region, hydrophobic surfaces are provided on the contact element at least around the contact region. Since during the plug-in process the contact region is strained through rubbing, this contact region loses partially or completely its hydrophobic properties. The environment around the contact region is, however, not mechanically strained during the plug-in process, so that the hydrophobic properties around the contact region remain unaffected and no liquid can reach the contact region. It is advantageously even so, that during the plug-in process any existing liquid is pushed out to the contact region from the region between the ends of the conductor tracks and the contact elements of the plug-in component due to the wedge-shaped narrowing gap.

In a preferred embodiment, the contact region of the contact elements is in each case formed by such a contact part, which towers above the surrounding surfaces of the contact elements. That is, on each contact element an elevation in the form of a nub, a pin, a bent off conductor strand or in another form is provided. In the coupling position this contact part, which towers above the contact element, contacts exclusively a conductor track of the electrical component. During the plug-in process, both the contact part and the contact region on the conductor track are stressed by rubbing. The ends of the conductor tracks are rendered into a bulging shape during the plug-in process. This plug-in movement and contacting leads through the outward bulging to an elongated abrasion point on the conductor tracks. However, since this elongated contact region on the conductor tracks is also surrounded and affected by hydrophobic surfaces, either on the conductor tracks or, however, hydrophobic surfaces on the contact element of the plug-in component, both the contact regions of the conductor tracks as well as the contract part remain free from liquids.

In the case of the contact elements, they may be contact pins of a plug-in component or, however, the contact elements are provided as flat conductor tracks on a flexible support. In this case, the towering contact part may be produced through embossment. Moreover, it is conceivable that the contact elements are formed by conductor strands of a ribbon cable. For an electrical contacting, the conductor strands in a potential contact region are exposed by the insulating layer and thus formed, in particular, bent so that existing contact parts are produced in the contact region. The bent conductor strands form a double-curved surface, which may also be provided with other contact parts. During the plug-in process, this curved surface of such a contact part comes into selective contact with the level conductor track at the beginning of the plug-in. This selective touching is optimal for electrical contact pairs and is unaffected by angular deviations.

Through the invention an electrical connection assembly exists which is liquid-tight and comprises a sealing which is independent of temperature. The plug-in and withdrawal forces are low and a high number of plug-in cycles is possible. With an opened plug-in connection it can be provided that the electrical contacts both on the electrical component as well as on the plug-in component remain free from liquids, whereby the live parts are protected against short circuiting. Thus protected parts can also be used under water, i.e. such a plug-in connection can be closed and opened under water. Here, the sealing is preferably achieved by inherent properties of the metallic contacts. No additional, space-demanding sealing elements are required. Additional hydrophobic surfaces in the region for the housing seal are also realised contact-free and without additional installation space. Furthermore, it is advantageous that a sealing of the connector of the plug-in component can also be provided retrospectively, i.e. such a plug-in component can also be fitted liquid-tight retrospectively. This can be a plug-in component for an electrical connection as well as for a data connection, for example, a USB connector.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

FIG. 3b shows an enlarged section of FIG. 3a, FIG. 3c shows a perspective partial view of a contact element.

DETAILED DESCRIPTION OF THE PREFERRED EMBODIMENTS

The electrical connection assembly, the new electrical components, the new plug-in components and the displacement of existing liquid from the contact zone during the plug-in process are explained below in more detail with reference to embodiments and drawings.

Figure 1:
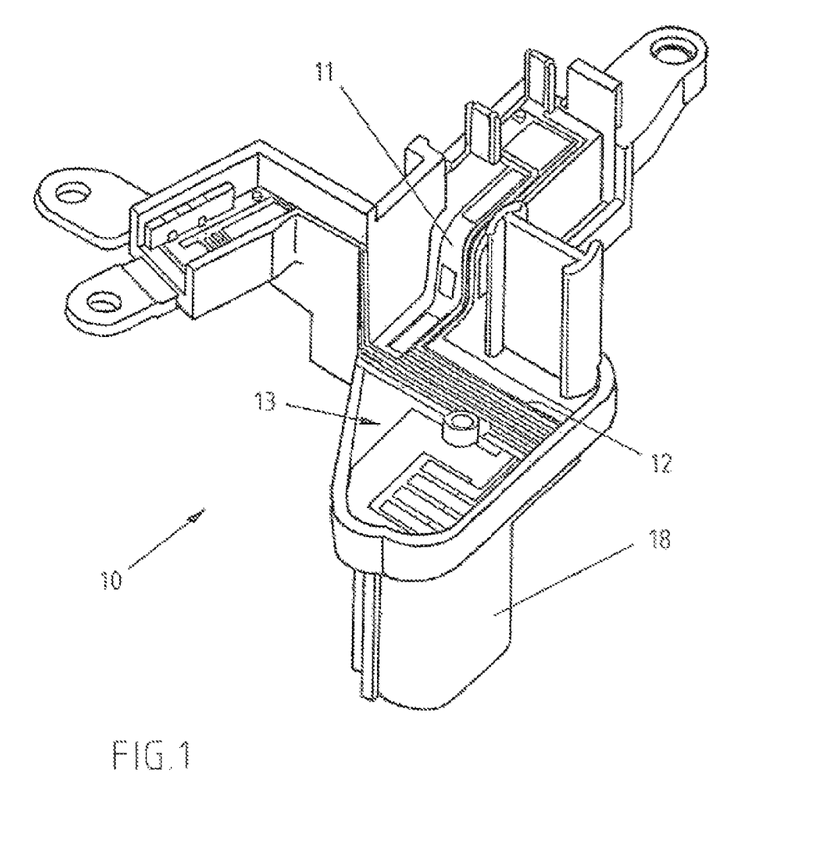
FIG. 1 shows a perspective view of a new electrical component, in accordance with a preferred embodiment of the present invention.

FIG. 1 shows an embodiment of an electrical component 10 according to the invention. In this case a component support, having a flexible support element 11, which exhibits conductor tracks 12, which may be connected in various terminal regions to further electrical components, for example to a switch, to a motor, and in the terminal region 13 to a plug-in component 20. The plug-in component 20 is plugged in from below into the electrical component 10. For the receiving and mechanical fixing of the plug-in component 20, a receiving sleeve 18 is provided in the terminal region 13.

Figure 2A:
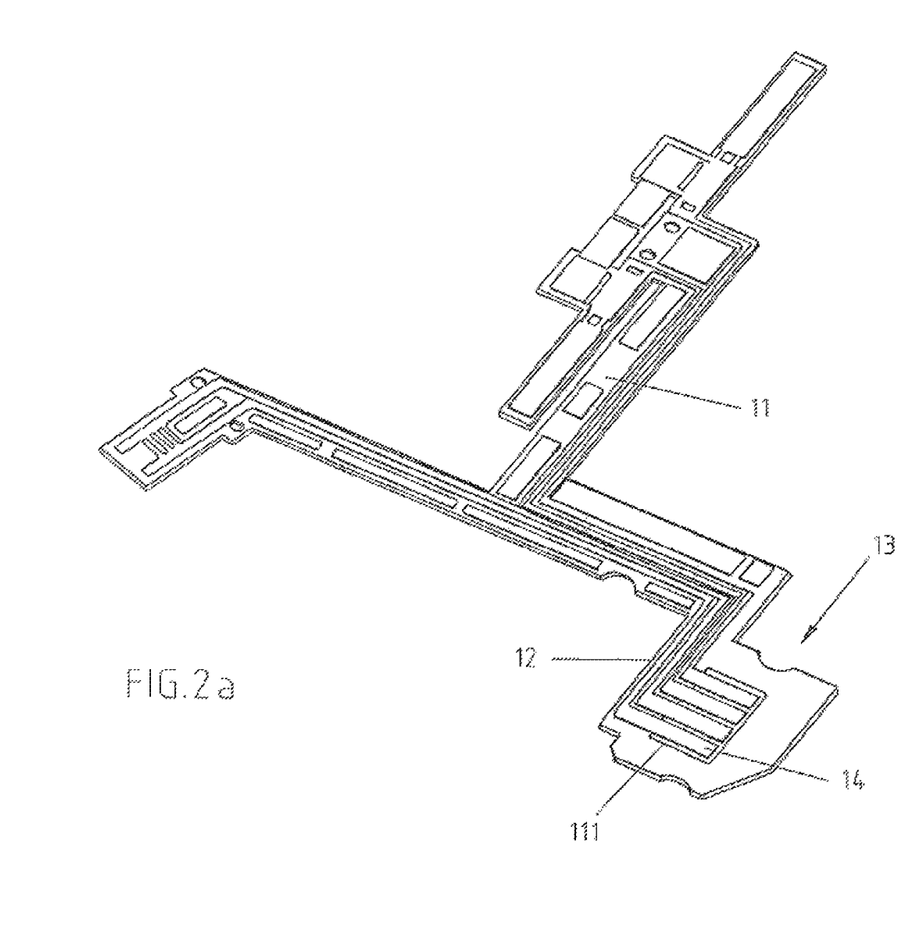
FIG. 2a shows a flat, flexible support for the electrical component of FIG. 1.
Figure 2B:
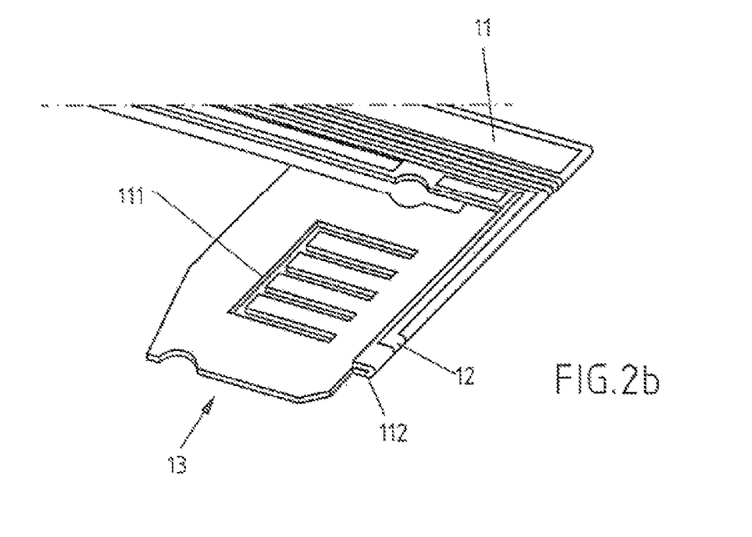
FIG. 2b shows the folded flexible support of FIG. 2a, FIG. 2c shows the folded flexible support of FIG. 2b with a support layer.
Figure 2C:
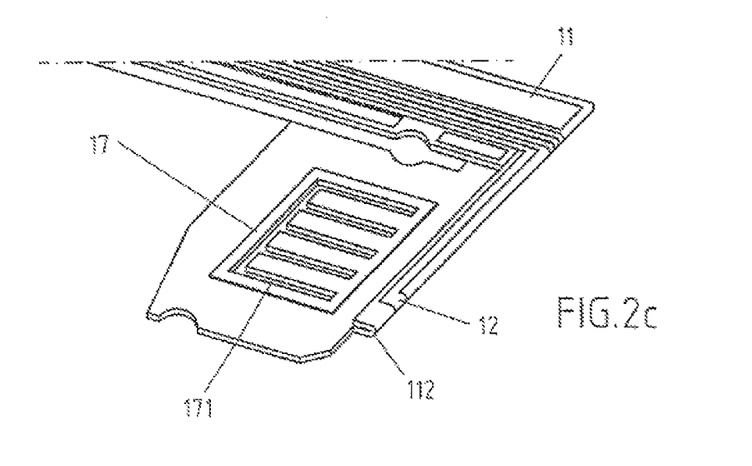

The flexible support 11 used in FIG. 1 is illustrated in FIG. 2a still in its flat form, i.e. before the deformation and mounting in the component support. This flexible support 11 consists of at least one non-conductive layer made of plastic, on which a further layer in the form of conductor tracks 12 is provided. In the respective terminal regions, in the terminal region 13 for the plug-in component 20, for example, the conductor tracks 12 are freely accessible. Outside the terminal region 13 and the further terminal regions, the conductor tracks 12 may be covered by a further non-conductive insulating layer, which is not to be deduced from the figures. Furthermore, it is evident from FIG. 2a that the ends 14 of the conductor tracks 12 are configured freely movable through slots 111 in the support 11. The slots 111 surround each end 14 of each conductor track 12 in the terminal region 13 in a U-shape. This is even clearer in the FIG. 2b. This FIG. 2b shows only the terminal region 13 of the flexible support 11 of FIG. 2a and after the deformation, i.e. adaptation of the flexible support 11 to the shape of the component support shown in FIG. 1. This deformation step also includes a folding of the flexible support 11 in the terminal region 13. In this way, the ends 14 of the conductor tracks 12 visible in FIG. 2a reach the terminal region 13 due to the fold 112 on the back of the flexible support 11. The bent back of the flexible support 11 in the terminal region 13, in particular the slots 111 in the flexible support 11, is visible in FIG. 2b. Due to the flexible design of the support 11, such a fold 112 is easily and space-savingly possible. In addition, on the back of the support 11, which is located in the terminal region 13 on the upper side, a support layer 17 is provided in the region of the ends 14 of the conductor tracks 12. In the example of FIG. 2c, this support layer 17 is a metallic leaf spring, which is adapted to the shape and size of the ends 14 of the conductor tracks 12 in this terminal region 13. This leaf spring provided as a support layer 17 also exhibits slots 171, which correspond to the slots 111 in the flexible support 11 and which ensure the movability of the ends 14 of the conductor tracks 12. Since the flexible support 11 made of plastic itself only ensures a weak support, the ends 14 of the conductor tracks 12 in this terminal region 13 are supported by such a support layer 17, which upon contact with the conductor tracks 12 ensures a sufficient contact pressure. In addition to or instead of a leaf spring, other elastic materials are also possible.

Figure 3A:
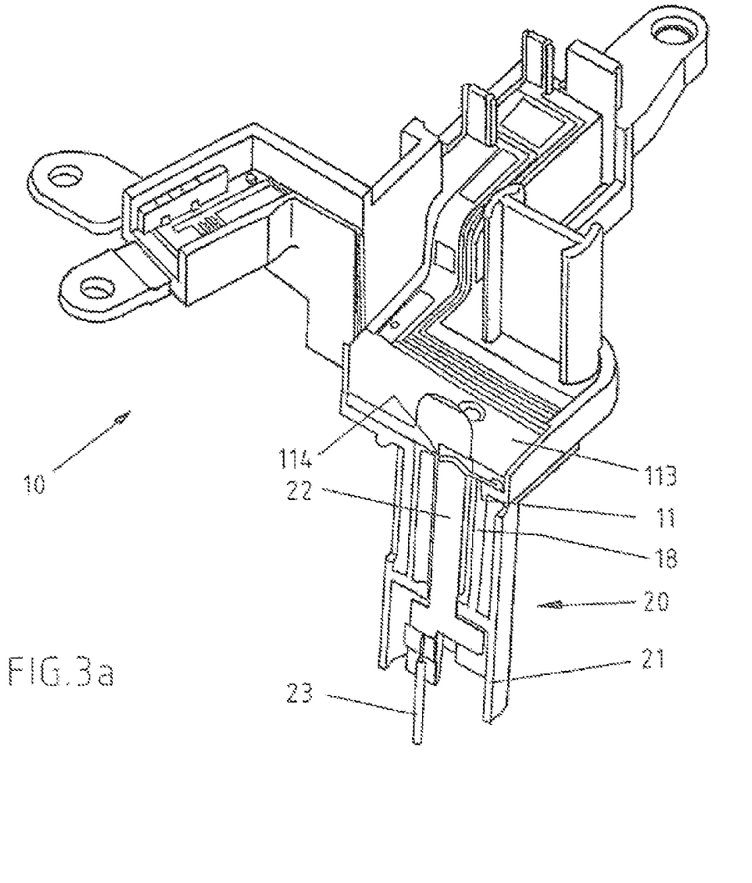
FIG. 3a shows a sectional view of the electrical connection assembly with the electrical component of FIG. 1.

During a plug-in contact, namely a plug-in of a plug-in component 20 from below in the receiving sleeve 18 in the terminal region 13, see FIG. 1, the still flat ends 14 of the conductor tracks 12 are bent upwards by the contact elements 22 of the plug-in component 20 making contact from below. The electrical connection assembly in the coupling position is shown in FIG. 3a, namely the electrical component 10 connected to the plug-in component 20. This plug-in component 20 comprises a number of contact elements 22, namely a number corresponding to the number of the ends 14 of the conductor tracks 12. These contact elements 22 are accommodated in a plug-in housing 21 and connected to electric leads 23. Electric leads 23 typically are electric wires having copper strands covered with an insulating sheath or flexible circuits with printed conductive tracks. The flexible support 11 is covered in the terminal region 13 with a cover 113. This cover 113 serves regionally in particular also as a backing layer 114 for the free ends 14 of the conductor tracks 12 of the flexible support 11 during the plug-in process.

Figure 3B:
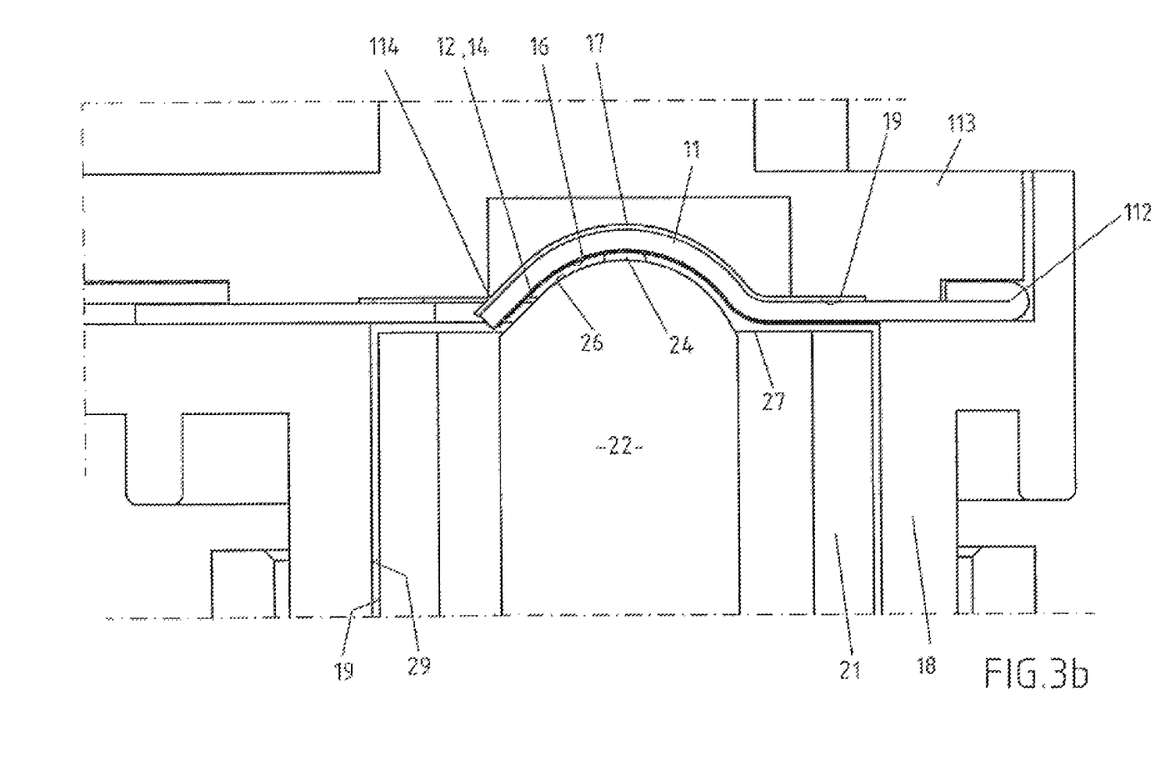

FIG. 3b shows an enlarged view of the coupling position. The plug-in component 20 is plugged into the electrical component 10 from below, i.e. in the direction of the plug-in. The plug-in housing 21 comprises the receiving sleeve 18 of the electrical component 10. The plug-in component 20 contacts in this coupling position with its contact elements 22 the ends 14 of the conductor tracks 12 of the electrical component 10. The pin-like contact element 22 deforms when plugging in the flat flexible support 11 with the conductor tracks 12, wherein each end 14 of the conductor tracks 12 is bent upwards, which is made possible by the free movement of the ends 14 of the conductor tracks 12. In the cover 113 a backing layer 114 and a correspondingly-sized recess are provided for the bent out ends 14 of the conductor tracks 12. During the plug-in process, the contact pressure exercised by the contact element 22 is maintained on the conductor tracks 12 by the elastic supporting layer 17.

In this embodiment, the pin-like contact element 22 of the plug-in component 20 contacts with its contact part 24 the conductor track 12 of the electrical component 10. This contact part 24 is an elevation on the contact element 22, i.e. it is raised above the surface of the contact element 22 in the plug-in direction. The surface of the contact part 24 represents the contact region of the contact element 22.

Figure 3C:
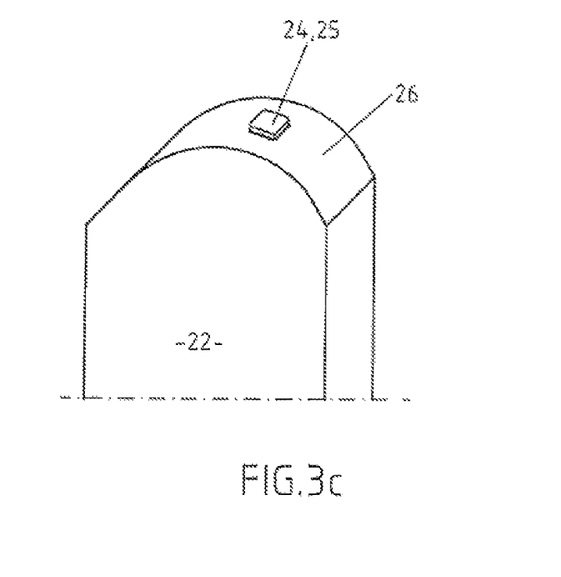

According to this embodiment, the ends 14 of the conductor tracks 12 are provided with a hydrophobic surface 16. Similarly, in this example, the surface of the contact element 22 shown in the plug-in direction also exhibits a hydrophobic surface 26. These hydrophobic surfaces 16, 26 have been achieved by a laser structuring, i.e. the metallic surfaces of the conductor tracks 12 and the coupling element 22 have, through this particular microstructuring itself, these hydrophobic properties. During a plug-in process, the contact elements 22 approach the conductor tracks 12. A narrow gap is formed in each case, which is narrowest at the contact point of the contact part 24. Any existing liquid is thereby displaced outwardly from the inside of the contact region 15, 25 due to the hydrophobic surfaces 16, 26. During such a plug-in process, the contact region 25 of a contact element 22 and the opposite contact region 15 on the conductor paths 12 and therefore the hydrophobic surfaces 16, 26 in these regions are strained through rubbing. After a plurality of plug-in contacts, these contact regions 15, 25 lose partially or completely their hydrophobic properties. In FIG. 3c the contact element 22 is visible with its towering contact part 24 before the first plug-in contact. A hydrophobic surface 26 is also still completely maintained on the contact part 24. After a plurality of plug-in contacts the hydrophobic property of the surface on the contact part 24 may be worn away. From FIG. 3c it is also to be deduced that the contact region 25 of the plug-in component 20, which in this case is formed by the surface of the contact part 24, even after the loss of the hydrophobic properties in this region continues to be completely surrounded by a hydrophobic surface 26, since this contact part 24 represents an elevation and the surrounding hydrophobic surface 26 on the contact element 22 is not mechanically strained during the plug-in contact. The hydrophobic property around the contact part 24 remains intact through the surrounding hydrophobic surface 26. Even after a high number of plug-in contacts, still no liquid reaches the contact region 25.

Figure 3D:
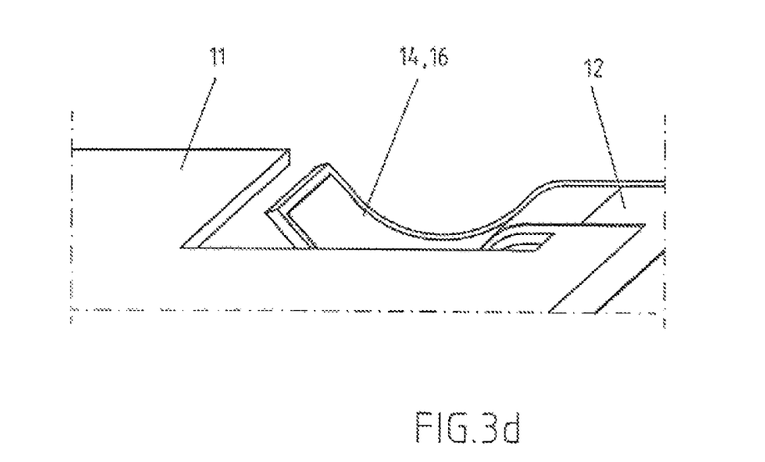
FIG. 3d shows a perspective partial view of the flexible support in the plugged-in state without the contact element.
Figure 5:
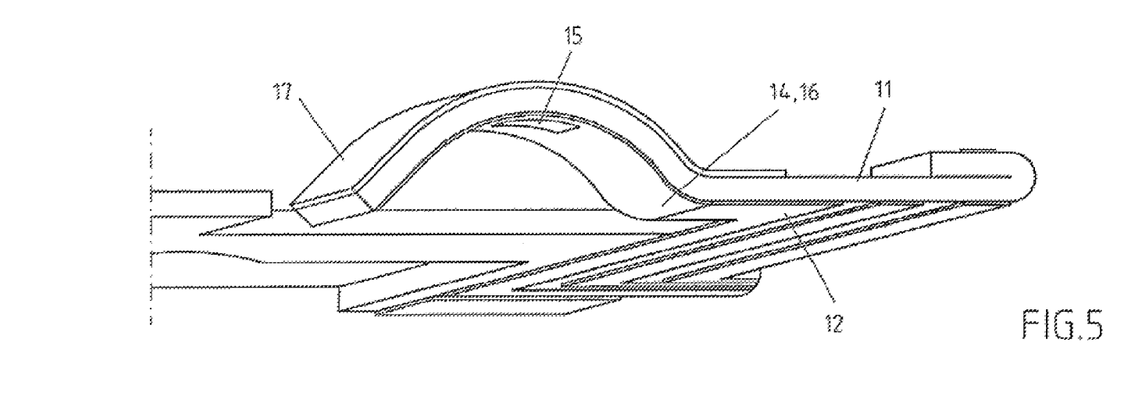
FIG. 5 shows a perspective partial view of the flexible support of FIG. 4.

The side opposite a contact part 24, i.e. an end 14 of the conductor tracks 12 without the support layer 114, which causes the bulging shape, is shown in FIG. 3d. In this example, a hydrophobic surface 16 is also provided at the ends 14 of the conductor tracks 12. During the plug-in process, the ends 14 of the conductor tracks 12 are buckled in the plug-in direction, i.e. the contact part 24 rubs in a longitudinal movement along the conductor track 12. Consequently, an elongated abrasion point results on the hydrophobic surfaces 16 of the ends 14 of the conductor tracks 12. See, for example, FIG. 5. But even in this case, such an elongated abrasion point continues to be completely surrounded by a hydrophobic surface 16 and the contact regions 15 on the conductor tracks 12 are protected from liquid contact.

Figure 4:
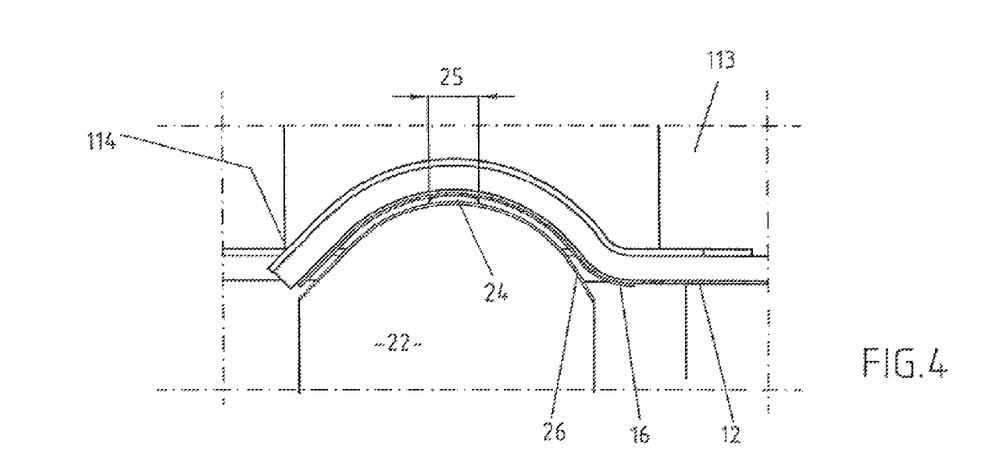
FIG. 4 shows a sectional view of a further electrical connection assembly.

FIG. 4 shows a further embodiment. Here, a partial section in the terminal region 13 exclusively from the electrical connection assembly is shown. In this example, the conductor tracks 12 are coated with a hydrophobic surface 16. Similarly, the contact element 22 exhibits on its surface showing in the plug-in direction a hydrophobic surface 26 produced through coating. Even in this case, a contact part 24 is provided that is elevated from the surface of the contact element 22 and therefore with its surface alone forms the contact region 25. On the opposite side we have the elongated contact region 15—see FIG. 5—which results in the bulging out due to the movement of the contact part 24 along the end 14 of the conductor track 12. After a plurality of plug-in contacts, this contact region 15 is visible, since in this region the coating of the hydrophobic surface 16 is rubbed away. But even after a high number of plug-in contacts, both the contact region 15 on the electrical component 10 as well as the contact region 25 on the plug-in component 20 surrounded by a sufficiently large hydrophobic surface 16, 26. In this example, a leaf spring as a support layer 17 also ensures the sufficient contact pressure.

Figure 6:
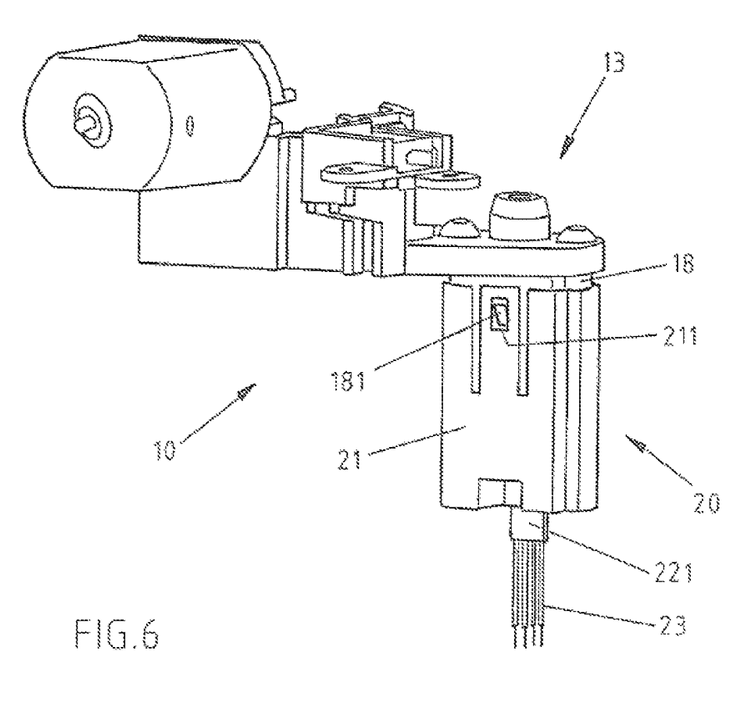
FIG. 6 shows a perspective view of a further electrical component with plug-in component in the coupling position.
Figure 7A:
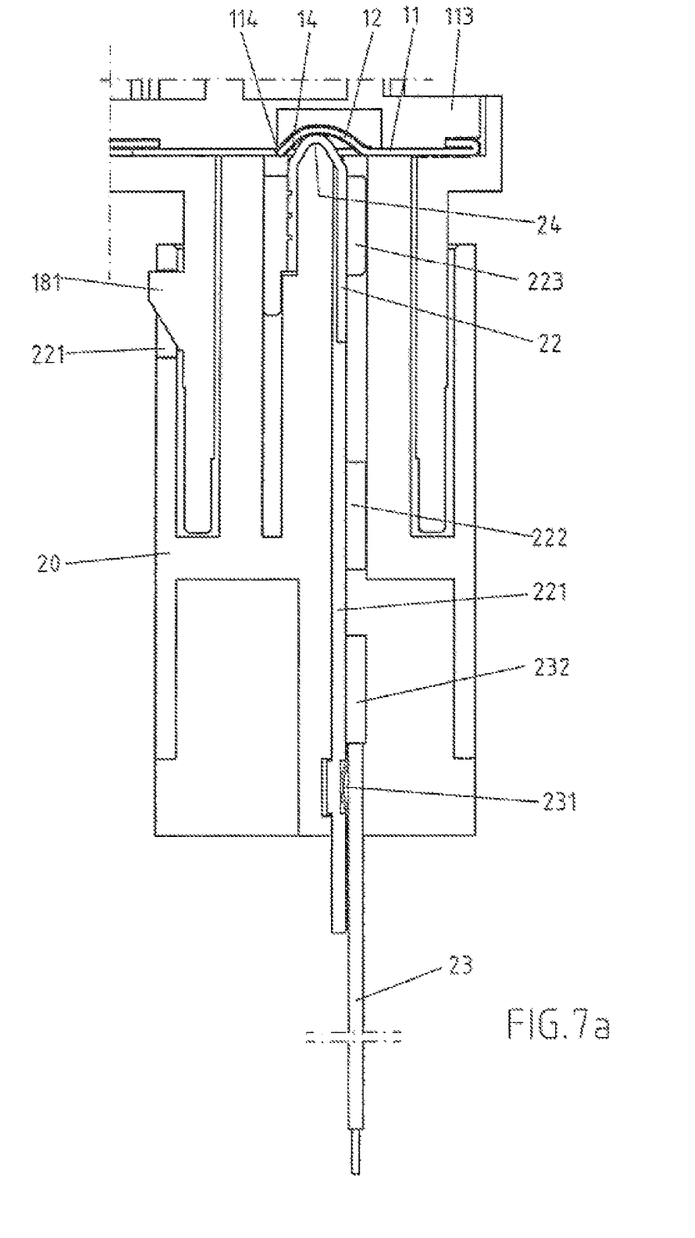
FIG. 7a shows a sectional view of the electrical connection assembly with the electrical component of FIG. 6.

FIG. 6 shows a further embodiment of an electrical connection assembly having the electrical component 10 according to FIG. 1 and having a further plugged-in plug-in component 20. This new plug-in component 20 is held on the electrical component 10 via a clamping connection. For this purpose a clamping arm 181 is provided on the receiving sleeve 18 of the electrical component, which engages in a corresponding clamping recess on the plug-in housing 21 of the plug-in component 20 and secures the plug-in layer of the plug-in component 20 on the electrical component 10. From outside a harness having the wires 23 leads into the plug-in housing 21 of the plug-in component 20. The wires 23 are connected to a ribbon cable 221, as can be better seen from FIG. 7a. The wires 23 and the ribbon cable 221 are electrically connected to each other via a cable connector 232. The ribbon cable 221 is held in the plug-in housing 21 via an elastomer seal 222. The elastomer seal 222 is adhered to the ribbon cable 221 and is compressed media-tight during the mounting in the plug-in component 20. The ribbon cable 221, including its exposed ends, which in the plug-in component 20 are secured from being pulled out by a cable connection 223, is stretched and in the stretched state form-fittingly connected to the plug-in component 20 by embossments 231. The electrical connection remains unaffected, since it takes place in the section lying in front having a cable connector 232. At the front of the plug-in component 20, the ribbon cable 221 is exposed by the insulation and represents a contact element 22. The ribbon cable 221 is in this front region bent to a point, the contact part 24, with which the plug-in component 20 contacts the conductor tracks 12 in the region of the free ends 14. The bent end of the ribbon cable 221 is held securely in the plug-in housing 21 in the front region via a cable connection 223.

Figure 7B:
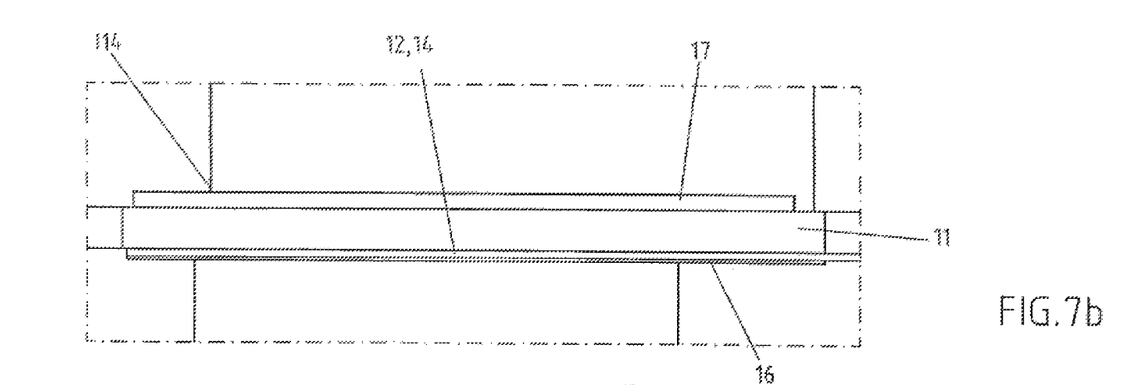
FIG. 7b shows an enlarged section of the electrical component in the uncoupled position.
Figure 7C:
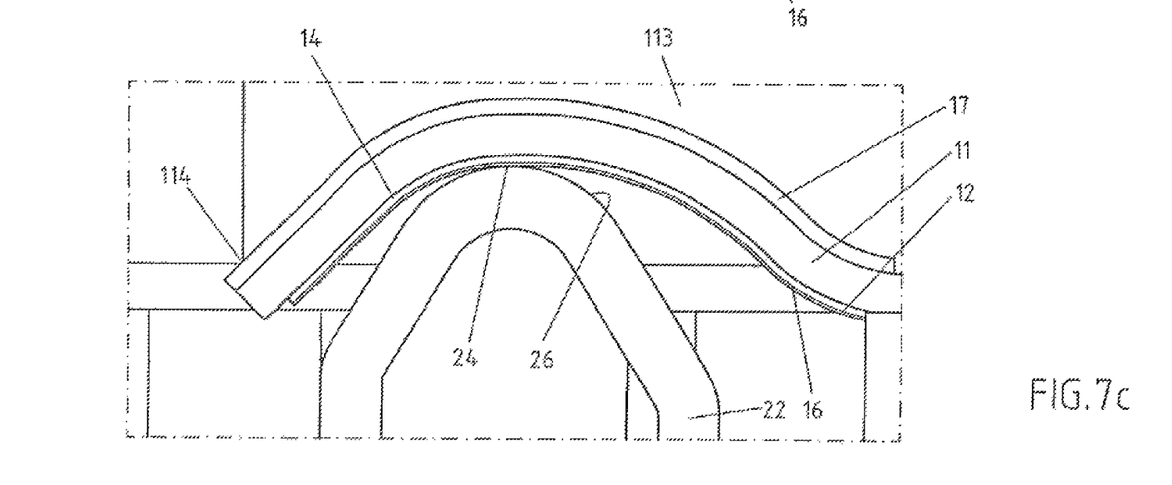
FIG. 7c shows an enlarged section of FIG. 7a, FIG. 7d shows a perspective partial view of FIG. 6.

Before such a plug-in component 20 is inserted into the electrical component 10, the free ends 14 of the conductor tracks 12 of the flexible support 11 still lie flat in the electrical component 10, as is evident from FIG. 7b. On one side of the flexible support 11 the support layer 17 is provided and on the other side the conductor tracks 12, which are contacted by the contact part 24 of the contact element 22 of the plug-in component 20. This contact side is provided with a hydrophobic surface 16. During the plug-in process, the bent conductor strands of the ribbon cable 221, which form the contact element 22, are pressed on the free ends 14 of the conductor tracks 12 of the flexible support 11. Here, the free ends 14 of the flexible support 11 have a backing layer 114 on the cover 113. During the bulging of the flexible support 11, the contact part 24 slides on the conductor track 12 until it is in the coupling position. In the enlarged illustration of FIG. 7c, the coupling position is clear. The contact parts 24, which are each formed by two curved surfaces of the exposed ribbon cable 221, approach the conductor tracks 12 and come into selective contact with them. In addition to the optimally selective touching between the contact parts 24 and the free ends 14 of the conductor tracks 12, the contact region is also sealed. This is because in this embodiment, on the one hand, the ends 14 of the conductor track is provided with a hydrophobic surface 16 and the contact element 22 throughout the whole bent region is provided with a hydrophobic surface 26. In fact, after a plurality of plug-in contacts the hydrophobic property of the surfaces on the contact part 24 may be worn away. But even in this case, the contact part 24 is completely surrounded by a hydrophobic surface 26 of the contact element 22, since the contact part 24 represents an elevation and the surrounding hydrophobic surface 26 on the contact element 22 is not mechanically strained during the plug-in contact. Thus, similarly, as shown in the configuration according to FIG. 3a, even in this arrangement, during a new insertion, i.e. during the approach of the contact elements 22 to the conductor tracks 12, the distance to the contacting is reduced and any existing liquid is displaced outwards due to the wedge-shaped narrowing gap to the contact region by the hydrophobic surfaces 16, 26 which form the gap.

Figure 7D:
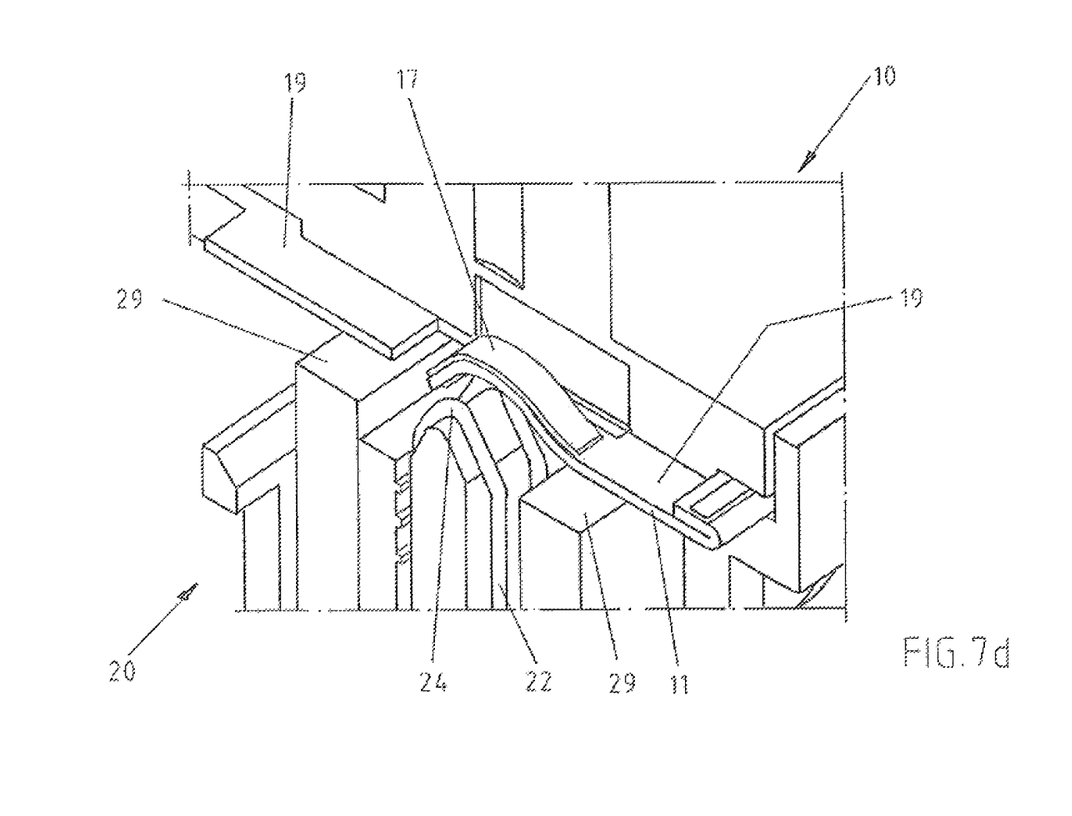

In addition to the hydrophobic surfaces 16, 26, which surround the respective contact region, further hydrophobic surfaces 19 for the sealing of the electrical component 10 and further hydrophobic surfaces 29 for the sealing of the plug-in component 20, shown in FIG. 7d, may be provided. Advantageously, these seals require no additional space compared to seals with sealing rings.

Figure 8:
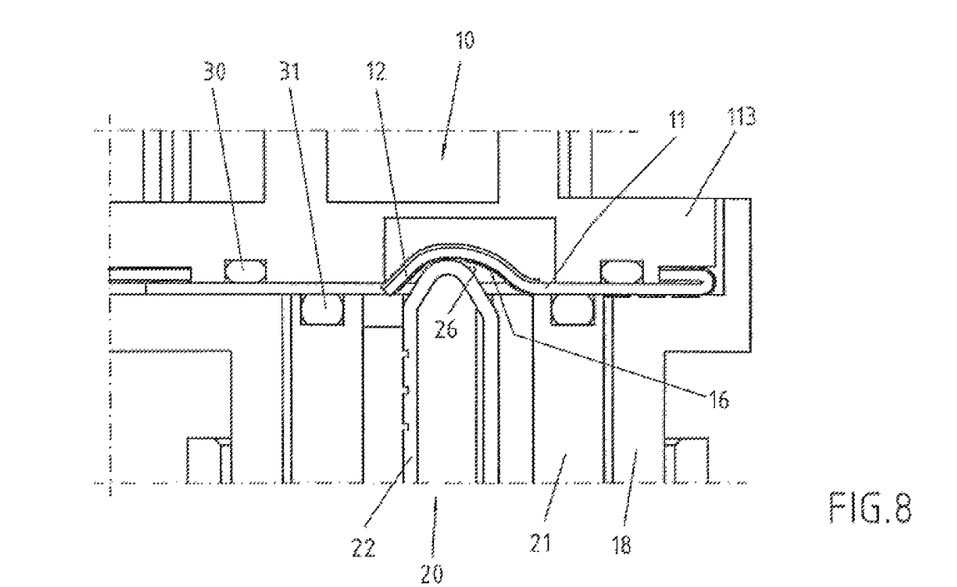
FIG. 8 shows a partial view of a further electrical connection assembly.

FIG. 8 shows an electrical connection assembly in which both a sealing ring 31 on the plug-in component 20 and a sealing ring 30 on the electrical component 10 are provided. Even in these known electrical connection assemblies with sealing rings 30, 31, the contact region may be kept free from liquids, in which hydrophobic surfaces 16 on the conductor tracks 12 of the flexible support 11 and hydrophobic surfaces 26 on the contact element 22 are provided retrospectively, in this case preferably by a hydrophobic coating.

The drawings only show selected embodiments. The invention is not limited to the examples. So it is also possible, for example, that only one hydrophobic surface 16 or 26 is provided, since during the plug-in process any existing liquid can be displaced from the narrow gap solely by one hydrophobic surface 16 or 26. Such a hydrophobic surface 16 can be provided alone on the electrical component 10, i.e. on the conductor tracks 12 of the flexible support 11, or alone on the plug-in component 20, i.e. on the surface of the coupling element 22. The invention therefore enables simply a sealing of the coupling position of an electrical connection assembly.

Furthermore, the individual parts, namely the electrical component 10 or the plug-in component 20 in the uncoupled position may also be protected from the effect of liquid, optionally by additional hydrophobic surfaces. FIG. 3b shows, for example, the provision of hydrophobic surfaces 19, 29, namely hydrophobic surfaces 19 on the receiving sleeve 18 of the electrical component 10 and hydrophobic surfaces 29 on the plug-in housing 21 of the plug-in component 20. During the plug-in process, a gap results between the plug-in housing 21 and the receiving sleeve 18. The penetration of liquids through this gap into the respective housing interior is effectively prevented by the surface 19 and/or the hydrophobic surface 29. Even the provision of sealing rings in the region of the front 27 of the plug-in component 20 can be waived if the hydrophobic surfaces 29 extend into this region. A plug-in component 20 is protected even in the uncoupled position by hydrophobic surfaces 26 and 29. For the liquid-tight sealing of an electrical connection assembly it would be sufficient if only the electrical component 10 exhibits corresponding hydrophobic surfaces 16, 19. This may be, in addition to the hydrophobic surface 16 on the ends 14 of the conductor tracks 12, an additional hydrophobic surface 19 around the terminal region 13, as shown in FIG. 3b. These additional hydrophobic surfaces 19 are preferably provided on the flexible support, since a cover 113 alone cannot protect the terminal region 13 from a liquid infiltration.

Advantageously, existing constructions may also be sealed retrospectively in the manner described.

In the description and claims of the present application, each of the verbs "comprise", "include", "contain" and "have", and variations thereof, are used in an inclusive sense, to specify the presence of the stated item or feature but do not preclude the presence of additional items or features.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of example only, and various other modifications will be apparent to persons skilled in the field without departing from the scope of the invention as defined by the appended claims.

The invention claimed is:

1. Electrical connection assembly between an electrical component and a plug-in component, the assembly comprising a flexible support supporting the electrical component, the flexible support having a plurality of conductor tracks with free ends that are exposed in a terminal region and each form contact surfaces,
   wherein the plug-in component has a number of counter contacts of contact elements assigned to the conductor tracks, which are each received in a plug-in housing and connected to electric leads, and
   wherein in a coupling position an electrically conductive connection exists between a contact region of the free ends of the conductor tracks of the electrical component and a contact region of the contact elements of the plug-in component,
   wherein for liquid-tight sealing, the free ends of the conductor tracks of the electrical component and/or the contact elements of the plug-in component are provided with water repellent structures at least regionally, and
   wherein even in an uncoupled position, the contact region of the conductor tracks and/or the contact elements is surrounded by a water repellent structure.

2. The assembly of claim 1, wherein for mechanical plug-in connection, the electrical component has a corresponding receiving sleeve oriented in the plug-in direction for receiving the plug-in housing of the plug-in component, and surfaces in the region of a gap are additionally provided with water repellent structures for sealing the gap between the plug-in housing and/or the receiving sleeve.

3. The assembly of claim 1, wherein only water repellent structures are provided on the flexible support of the electrical component for sealing the connection.

4. The assembly of claim 1, wherein the water repellent structures have been produced from the metallic material of the conductor tracks and/or from the metallic material of the contact element.

5. The assembly of claim 1, wherein, in the coupling position, electrical contact exists in each case between the free end of the conductor tracks of the flexible support of the electrical component and a contact part of the plug-in component projecting away from the surface of the contact elements and the contact region, wherein the water repellent structures of the conductor paths and the water repellent structures of the contact elements form surfaces of the gap.

6. Electrical component for the electrical connection assembly of claim 1, the electrical component comprising a flexible support having a plurality of conductor tracks having ends,
   wherein at least in one terminal region the ends of the conductor tracks are exposed and each form contact surfaces,
   wherein the ends of the conductor tracks are freely movable through slots in the flexible support, wherein the slots surround the ends of the conductor tracks in a U-shape, and
   wherein the flexible support is bent in the terminal region, so that the exposed contact surfaces of the conductor tracks are located on the underside and a resilient support layer is provided on the opposite upper side of the flexible support.

7. The electrical component of claim 6, wherein for liquid-tight sealing, the free ends of the conductor tracks are provided with water repellent structures, so that the contact region is completely surrounded by the water repellent structures.

8. The electrical component of claim 6, wherein the resilient support layer is a metallic spring leaf, which has slots fitting the slots of the flexible support.

9. Plug-in component for the electrical connection assembly of claim 1, the plug-in component comprising a number of contact elements, which are each received in a plug-in housing and connected to electric leads,
   wherein for liquid-tight sealing, the contact elements are provided with water repellent structures, so that a potential contact region is surrounded by water repellent structures.

10. The plug-in component of claim 9, wherein the contact region of the contact elements is formed in each case by a contact part, which projects beyond the surrounding surface of the contact element.

11. The plug-in component of claim 9, wherein the contact elements are provided as flat conductor tracks on a flexible support and the contact part projecting beyond the surface of the conductor tracks in each case has been produced by embossment.

12. The plug-in component of claim 9, wherein the contact elements are formed by conductor strands of a ribbon cable, wherein the conductor strands exposed by the insulating layer are shaped so that they have contact parts protruding into the contact region.

* * * * *